United States Patent
Yu et al.

(10) Patent No.: US 8,030,923 B2
(45) Date of Patent: Oct. 4, 2011

(54) METHOD AND SYSTEM TO PERFORM PHASE CORRECTION FOR SPECIES SEPARATION IN MAGNETIC RESONANCE IMAGING

(75) Inventors: Huanzhou Yu, Menlo Park, CA (US); Ann Shimakawa, Palo Alto, CA (US); Charles McKenzie, London (CA)

(73) Assignee: General Electric Company, Schenectady, NY (US)

( * ) Notice: Subject to any disclaimer, the term of this patent is extended or adjusted under 35 U.S.C. 154(b) by 380 days.

(21) Appl. No.: 12/415,545

(22) Filed: Mar. 31, 2009

(65) Prior Publication Data
US 2010/0244822 A1    Sep. 30, 2010

(51) Int. Cl.
*G01V 3/00* (2006.01)
(52) U.S. Cl. ......................... 324/309; 324/307
(58) Field of Classification Search .......... 324/300–322; 600/407–445
See application file for complete search history.

(56) References Cited

U.S. PATENT DOCUMENTS

| | | | | |
|---|---|---|---|---|
| 6,320,380 B1 * | 11/2001 | Wu et al. | ....................... | 324/309 |
| 7,098,662 B2 * | 8/2006 | Hinks et al. | ................... | 324/318 |
| 7,777,485 B2 * | 8/2010 | Dumoulin et al. | ............ | 324/309 |
| 2007/0106150 A1 * | 5/2007 | Greiser et al. | ................ | 600/413 |

OTHER PUBLICATIONS

Bornertm Peter et al.; "Whole-Body 3D Water/Fat Resolved Continuously Moving Table Imaging; Journal of Magnetic Resonance Imaging"; 25:660-665 (2007).
Lu, Wenmiao et al.; "Water-Fat Separation with Bipolar Multiecho Sequences"; Magnetic Resonance in Medicine, 60:198-209 (2008).
Li, Zhiqiang et al.; "Fast Decomposition of Water and Lipid Using a GRASE Technique with the IDEAL Algorithm"; Magnetic Resonance in Medicine, 57:1047-1057 (2007).
Koken, P. et al.; Fast Single Breath-hold 3D Abdominal Imaging with Water-Fat Separation; Proc. Intl. Soc. Magnetic Resonance Medicine, 15:1623 (2007).
Lu, W. et al.; Chemical Shift Correction in Bipolar Multi-Echo Sequences for Water and Fat Separation; Proc. Intl. Soc. Magnetic Resonance Medicine, 15:1622 (2007).

* cited by examiner

*Primary Examiner* — Brij Shrivastav
(74) *Attorney, Agent, or Firm* — Fletcher Yoder

(57) ABSTRACT

Methods and systems are provided for processing a magnetic resonance images. In one embodiment, first and second sets of lines of magnetic resonance imaging signals are acquired. The acquired sets of lines have readout gradients that are reversed in polarity with respect to one another. A two-dimensional phase error is determined using the first and second set of lines.

20 Claims, 5 Drawing Sheets

METHOD AND SYSTEM TO PERFORM PHASE CORRECTION FOR SPECIES SEPARATION IN MAGNETIC RESONANCE IMAGING

BACKGROUND OF THE INVENTION

The subject matter disclosed herein relates generally to magnetic resonance imaging systems and, more particularly, to techniques for species separation using magnetic resonance imaging systems.

The use of medical imaging technologies has become commonplace in the medical community. Such imaging technologies typically allow the acquisition of images which depict the internal structures (internal tissues and organs, bones, and so forth) and/or biochemical functions of a patient without the use of invasive procedures. That is, medical imaging technologies typically allow the internal structures and/or functions of a patient to be observed without surgery or other invasive procedures.

One such medical imaging technology is known as magnetic resonance imaging (MRI). MRI systems typically employ magnetic fields and pulses of radio frequency (RF) energy to generate images based on the gyromagnetic properties of tissues and structures within the body. For example, magnetic resonance imaging (MRI) systems may employ a primary magnetic field to generally orient susceptible molecules (such as hydrogen nuclei in water molecules) within the field and a radio frequency (RF) pulse to disrupt this orientation. The reorientation of molecules within the primary magnetic field after this disruption may generate signals that may be detected and used to generate images of the internal structures and/or functions within the patient. Time-varying magnetic gradient fields may also be applied to the subject so that the generated signals may be localized with respect to x-, y-, and z-axes, allowing an image to be generated.

In some instances it may be difficult to distinguish certain types of tissues from other materials of interest using MRI techniques. For example, fat tissue and water within the body may generate similar signals, making it difficult to distinguish between fat tissue and water in the resulting images.

BRIEF DESCRIPTION OF THE INVENTION

In one embodiment, a method is provided for processing magnetic resonance images. The method comprises acquiring a first set of lines of magnetic resonance imaging signals with a first read-out gradient at at least two echo times. In addition, a second set of lines of magnetic resonance imaging signals with a second read-out gradient that has reversed polarity with respect to the first read-out gradient at the same echo times is acquired. A two-dimensional phase error is determined using the first set of lines of magnetic resonance imaging signals and the second set of lines of magnetic resonance imaging signals.

In another embodiment, a magnetic resonance imaging system is provided. The magnetic resonance imaging system comprises a scanner that comprises a primary magnet coil, a set of gradient coils, and a RF coil. The system also comprises scanner control circuitry capable of controlling operation of the scanner. The scanner control circuitry comprises a memory capable of storing a first pulse sequence and a second pulse sequence and control circuitry capable of implementing the first and the second pulse sequence using the primary magnet coil, the set of gradient coils, and the RF coil. The first pulse sequence, when executed, generates a first set of lines of imaging signals having a first read-out gradient while the second pulse sequence, when executed, generates a second set of lines of imaging signals having a second read-out gradient that has reversed polarity with respect to the first read-out gradient. The system also comprises system control circuitry capable of controlling operation of the scanner control circuitry.

In a further embodiment, a computer-readable medium physically encoding one or more routines is provided. The computer-readable medium comprises a routine capable of acquiring first and second sets of lines of magnetic resonance imaging signals. The first and second sets of lines have read-out gradient polarities that are opposite to one another. The computer-readable medium also comprises a routine capable of determining a two-dimensional phase error using the first and second sets of lines and a routine capable of recovering an intrinsic signal after correcting for the two-dimensional phase error. In addition, the computer-readable medium comprises a routine capable of generating one or more species specific images using the intrinsic signal.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Magnetic resonance imaging (MRI) is a useful technology for generating internal views of a patient that might not be easily obtained using other techniques. In addition, to generate images, an MRI system utilizes magnetic fields and radio frequency (RF) energy and, therefore does not subject the patient to X-rays or gamma rays where the patient dosage may be an issue. One issue that may arise in MRI techniques, however, is a difficulty in distinguishing between certain molecular species in the patient that generate similar contrast (i.e., signal peaks) in response to the imaging protocol.

Examples of such species include water and fat tissue as well as silicone (when present), which can be difficult to distinguish in an MR image due to the closeness of the detected signals peaks generated by these species. In addition, in some circumstances, it may be desirable to separate signals associated with certain non-proton species, such as C13 signals from pyruvate, lactate, alanine, and/or bicarbonate, which may be difficult to distinguish. To address this difficulty, the present disclosure relates techniques may be employed to separate the signals of different molecular species.

Figure 1:
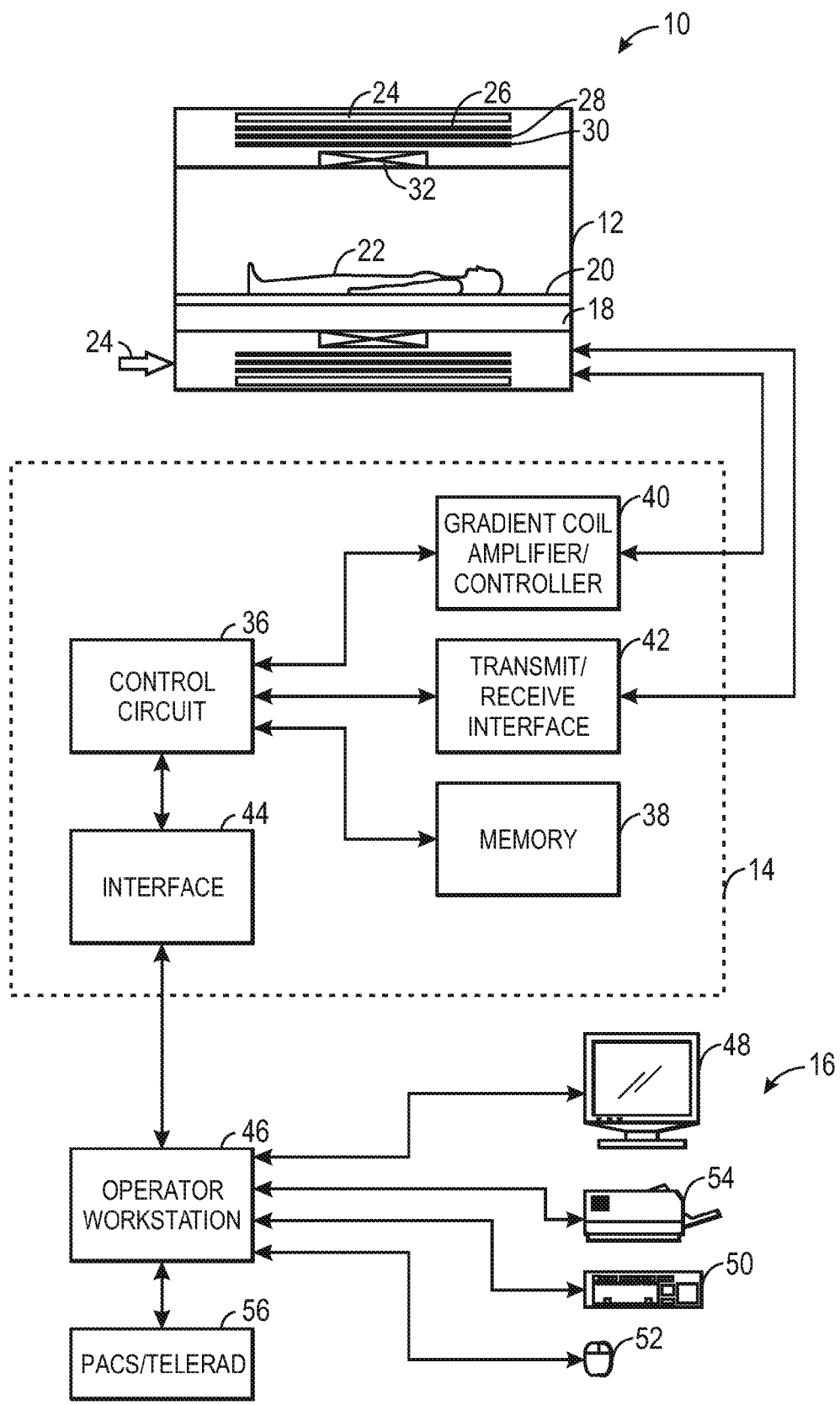
FIG. 1 is a diagrammatical representation illustrating an embodiment of an MRI system that employs interleaved gradient coils in accordance with an aspect of the present disclosure.

With the foregoing in mind, and turning now to the drawings, FIG. 1 depicts a magnetic resonance imaging (MRI) system 10 that includes a scanner 12, scanner control circuitry 14, and system control circuitry 16. While the MRI system 10 may include any suitable MRI scanner or detector, in the illustrated embodiment the system includes a full body scanner comprising a patient bore 18 into which a table 20 may be positioned to place a patient 22 in a desired position for scanning. The scanner 12 may be of any suitable type of magnetic field strength, including scanners varying from 0.5 Tesla field strength to 3 Tesla field strength and beyond.

The scanner 12 may include a series of associated coils for producing controlled magnetic fields, for generating radio frequency (RF) excitation pulses, and for detecting emissions from gyromagnetic material within the patient in response to such pulses. In the diagrammatical view of FIG. 1, a primary magnet coil 24 is provided for generating a primary magnetic field generally aligned with the patient bore 18. A series of gradient coils 26, 28 and 30 are grouped in a coil assembly for generating controlled magnetic gradient fields during examination sequences as described more fully below. An RF coil 32 is provided for generating RF pulses for exciting the gyromagnetic material. Power may be supplied to the scanner 12 in any appropriate manner, as indicated generally at reference numeral 34. In the embodiment illustrated in FIG. 1, the RF coil 32 also serves as a receiving coil. Thus, the RF coil 32 may be coupled with driving and receiving circuitry in passive and active modes for receiving emissions from the gyromagnetic material and for applying RF excitation pulses, respectively. Alternatively, various configurations of receiving coils may be provided separate from RF coil 32. Such coils may include structures specifically adapted for target anatomies, such as head coil assemblies, and so forth. Moreover, receiving coils may be provided in any suitable physical configuration, including phased array coils, and so forth.

In a present configuration, the gradient coils 26, 28 and 30 may be formed of conductive wires, bars or plates which are wound or cut to form a coil structure which generates a gradient field upon application of control pulses. The placement of the coils within the gradient coil assembly may be done in several different orders and with varying configurations, as described in greater detail below. Generally, a z-gradient coil 26 may be positioned at an outermost location, and is formed generally as a solenoid-like structure which has relatively little impact on the RF magnetic field. The coils 28 and 30 may be x-axis and y-axis coils respectively.

The coils 26, 28, and 30 of the scanner 12 may be controlled by external circuitry to generate desired fields and pulses, and to read signals from the gyromagnetic material in a controlled manner. When the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, the RF coil 32 may generate an RF frequency pulse at or near the Larmor frequency of the material of interest, resulting in rotation of the net aligned moment to produce a net transverse magnetic moment. This transverse magnetic moment precesses around the main magnetic field direction, emitting RF signals that are detected by the scanner 12 and processed for reconstruction of the desired image.

The gradient coils 26, 28 and 30 may serve to generate precisely controlled magnetic fields, the strength of which vary over a predefined field of view, typically with positive and negative polarity. When each coil is energized with known electric current, the resulting magnetic field gradient is superimposed over the primary field and produces a desirably linear variation in the axial component of the magnetic field strength across the field of view. The field may vary linearly in one direction, but may be homogenous in the other two. The three coils 26, 28, and 30 have mutually orthogonal axes for the direction of their variation, enabling a linear field gradient to be imposed in an arbitrary direction with an appropriate combination of the three gradient coils 26, 28, and 30.

The pulsed gradient fields may perform various functions integral to the imaging process. Some of these functions are slice selection, frequency encoding and phase encoding. These functions can be applied along the x-, y- and z-axis of the original coordinate system or along other axes determined by combinations of pulsed currents applied to the individual field coils.

The slice select gradient field may determine a slab of tissue or anatomy to be imaged in the patient, and may be applied simultaneously with a frequency selective RF pulse to excite a known volume of spins that may precess at the same frequency. The slice thickness may be determined by the bandwidth of the RF pulse and the gradient strength across the field of view.

The frequency encoding gradient, also known as the readout gradient, is usually applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the read-out gradient and after the slice select gradient. Localization of spins in the gyromagnetic material in the phase encode direction is accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

A great number of variations may be devised for pulse sequences employing the exemplary gradient pulse functions described above, as well as other gradient pulse functions not explicitly described here. Moreover, adaptations in the pulse sequences may be made to appropriately orient the selected slice and the frequency and phase encoding to excite the desired material and to acquire resulting MR signals for processing.

The coils of the scanner 12 are controlled by the scanner control circuitry 14 to generate the desired magnetic field and radiofrequency pulses. In the diagrammatical view of FIG. 1, the control circuitry 14 thus includes a control circuit 36 for commanding the pulse sequences employed during the examinations, and for processing received signals. The control circuit 36 may include any suitable programmable logic device, such as a CPU or digital signal processor of a general purpose or application-specific computer. Further, the control circuit 36 may include memory circuitry 38, such as volatile and/or non-volatile memory devices (or other suitable computer-readable media) for storing physical and logical axis configuration parameters, examination pulse sequence descriptions, acquired image data, programming routines, and so forth, used during the examination sequences implemented by the scanner 12.

Interface between the control circuit 36 and the coils of the scanner 12 may be managed by amplification and control circuitry 40 and by transmission and receive interface circuitry 42. The amplification and control circuitry 40 includes amplifiers for each gradient field coil 26, 28, and 30 to supply drive current in response to control signals from the control circuit 36. The receive interface circuitry 42 includes additional amplification circuitry for driving the RF coil 32. Moreover, where the RF coil 32 serves both to emit the RF excitation pulses and to receive MR signals, the receive interface circuitry 42 may include a switching device for toggling the RF coil between active or transmitting mode, and passive or receiving mode. A power supply, denoted generally by reference numeral 34 in FIG. 1, is provided for energizing the primary magnet 24. Finally, the scanner control circuitry 14 includes interface components 44 for exchanging configuration and image data with the system control circuitry 16.

The system control circuitry 16 may include a wide range of devices for facilitating interface between an operator or radiologist and the scanner 12 via the scanner control circuitry 14. In the illustrated embodiment, for example, an operator workstation 46 is provided in the form of a computer workstation employing a general purpose or application-specific computer. The station also typically includes memory circuitry (or other suitable computer readable media) for storing examination pulse sequence descriptions, examination protocols, user and patient data, image data, both raw and processed, and so forth, such as pulse sequence descriptions, protocols, routines, and algorithms suitable for implementing the presently disclosed techniques when executed on the workstation 46. The station may further include various interface and peripheral drivers for receiving and exchanging data with local and remote devices. In the illustrated embodiment, such devices include a monitor 48, a conventional computer keyboard 50, and an alternative input device such as a mouse 52. A printer 54 is provided for generating hard copy output of documents and images reconstructed from the acquired data. In addition, the system 10 may include various local and remote image access and examination control devices, represented generally by reference numeral 56 in FIG. 1. Such devices may include picture archiving and communication systems, teleradiology systems, and the like.

In certain embodiments, an MRI system 10 as described with respect to FIG. 1 may be used to store and implement routines for generating separate species images, such as water, fat, and/or silicone images. In one such embodiment, multiple echoes (such as two, three or more) are acquired within one repetition time (TR), which is the time between the application of one RF pulse and the next RF pulse. Such an embodiment may reduce the required scan time compared to other techniques that may only acquire a single echo within each TR interval. Even within these multi-echo approaches, however, there are variations. For example, "unipolar" sequences may be employed which acquire all echoes using the same gradient polarity (i.e., positive, or negative). Alternatively, "bipolar" sequences may instead be employed which collect echoes during both positive and negative gradient lobes.

Figure 2:
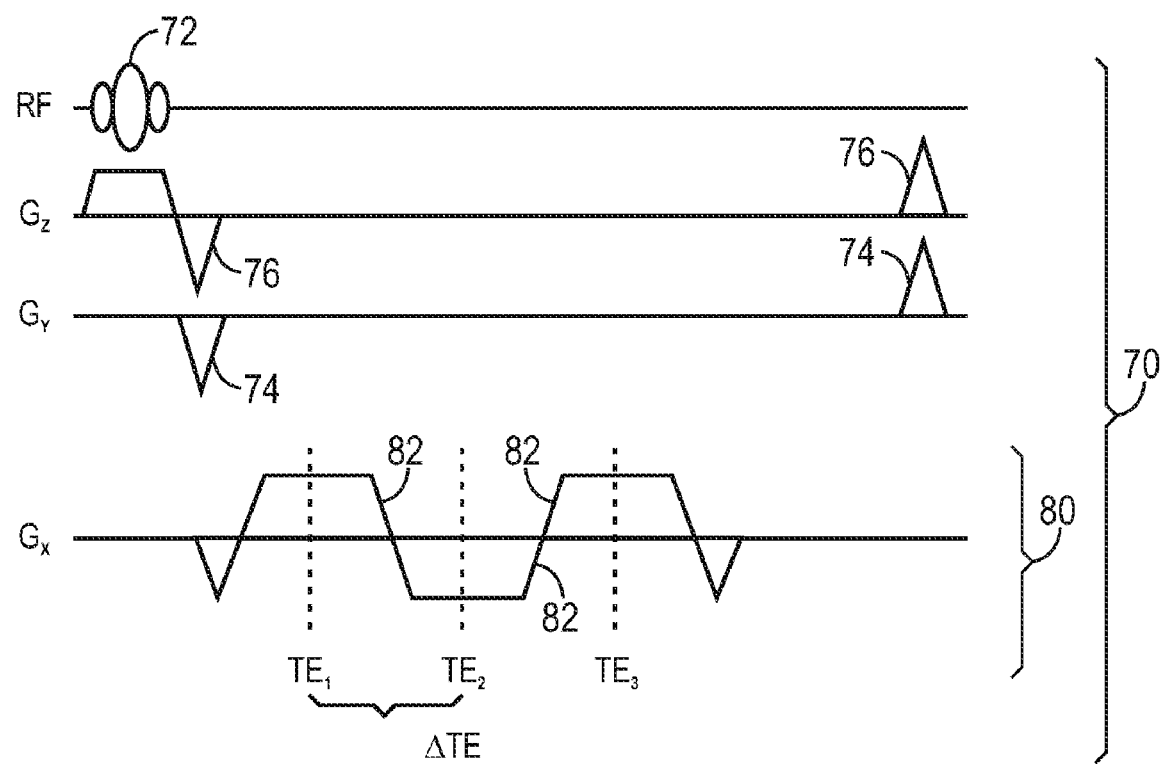
FIG. 2 depicts an example of a pulse sequence diagram depicting timing and corresponding multi-echo bipolar gradient acquisition in accordance with an aspect of the present disclosure.

For example, in accordance with one embodiment of the present disclosure, FIG. 2 depicts an example of a pulse sequence 70 consisting of a sequence of RF 72 and y- and z-gradient pulses 74, 76 that may generate responsive signals in a tissue undergoing imaging. The generated signals may each correspond to a different echo time (TE), which is the time between the application of an RF pulse 72 and the signal peak detected at the RF coil 32 (FIG. 1). In FIG. 2, three echo times 82 ($TE_1$, $TE_2$, and $TE_3$) are depicted as being generated in response to the pulse sequence 70 with the "bipolar" read-out gradient waveform 80. Two of the depicted echo times ($TE_1$ and $TE_3$) are depicted as being collected from a positive gradient polarity while the remaining echo time ($TE_2$) is depicted as being collected from a negative gradient polarity. That is, the depicted multi-echo read-out of FIG. 2 80 is bipolar.

Such bipolar techniques may offer a variety of benefits in comparison to unipolar approaches. For example, scan efficiency may be improved compared to unipolar approaches due to the removal of "fly-back" gradients between echoes, allowing more time in each TR interval to be used to collect data and thereby improving signal-to-noise ratio per scan time. Further, compared to unipolar approaches, bipolar approaches allow minimum echo spacing to be reduced and allow minimum TR to be reduced, thereby reducing overall scan time. Further, bipolar approaches may be less sensitive to patient motion.

One issue that may arise with bipolar techniques, however, is the possibility of phase errors that may impact image quality. Such phase errors may be caused by eddy currents that occur during system operation and/or due to other system nonidealities. Further, the phase errors may differ between the positive and negative gradient lobes, thereby reducing or disrupting the phase consistency between echoes, which can prevent or reduce effective species separation in the generated images.

Phase errors may occur in one-dimension or in two-dimensions. For example, one dimensional phase errors may occur in the read-out direction ($k_x$) due to eddy currents in the gradient coils or due to gradient imperfections in the system. Such one-dimensional phase errors are mostly linear along the read-out direction and may be addressed by realigning the k-space. Additionally, filter response asymmetry may add non-linear one-dimensional phase errors in the read-out direction. Such one-dimensional non-linear phase errors may be estimated and corrected by collecting reference data without phase encoding.

Additionally, a phase error from a bipolar gradient may vary in the phase-encoding ($k_y$) or slice-direction ($k_z$) as well, resulting in a two-dimensional phase error in the signal. Such two-dimensional phase errors may result from cross term eddy currents in which the read-out gradient generates an extra pulse on the y- and/or z-gradients, typically generating a phase error that is generally linear in the y-direction. In addition, two-dimensional phase errors may result from concomitant gradient terms and depend on the slice-orientation and the phase-encoding direction. In addition, spatial or location dependent two-dimensional phases errors may result from non-linear higher-order eddy current effects from other conducting structures (i.e., structures other than the gradient coils) in the system, such as the RF receive coils.

Further, in bipolar data acquisitions, the inconsistency between opposite polarities may occur for reasons other than phase errors. For example, filter asymmetry may result in amplitude differences of the read-out lines acquired with opposite gradient polarities. Such effects may primarily occur in the read-out direction. Embodiments of the present disclosure may allow for the correction of two-dimensional phase errors observed in bipolar sequence acquisitions and of such amplitude effects observed due to filter asymmetry. In embodiments in which the amplitude effects are corrected, the present techniques may be applied in multi-echo T2* estimation applications where the magnitude images at different echoes are used as a fit for a bi-exponential decay.

With the foregoing in mind, signals acquired with the positive (+) and negative (−) gradient polarities can be described by:

$$s_i^\pm(x,y) = s_i(x,y) \cdot F(\pm x) \cdot e^{\pm j\theta_i(x,y)} \quad (1)$$

where the subscript i denotes the echo index (e.g., 1, 2, 3, . . . ), $s_i(x,y)$ is the intrinsic signal without phase errors induced by bipolar gradients, $F(\pm x)$ is filter asymmetry induced amplitude modulation, and $e^{\pm j\theta_i(x,y)}$ is the two-dimensional phase error that has opposite signs with the positive and negative gradient polarities.

In one embodiment of the present technique, in addition to the regular data acquisition with the bipolar gradient, additional lines of data (i.e., reference data) are acquired with reversed gradient polarities. The reference data may, in one embodiment, be acquired with phase-encoding (i.e., with phase-encoding turned on). However, the number of phase-encoding lines acquired with the reference data may be different from the number of phase-encoding lines acquired in the regular (i.e., imaging) data acquisition. That is, if N lines of phase-encoded data may be acquired in the regular data acquisition and M lines of phase-encoded data may be acquired in the reference data acquisition such that M does not necessarily equal N. One example of such an acquisition strategy is depicted in FIG. 3, which generally depicts steps of a technique for separating signals of two or more molecular species in accordance with one embodiment of the present technique.

Figure 3:
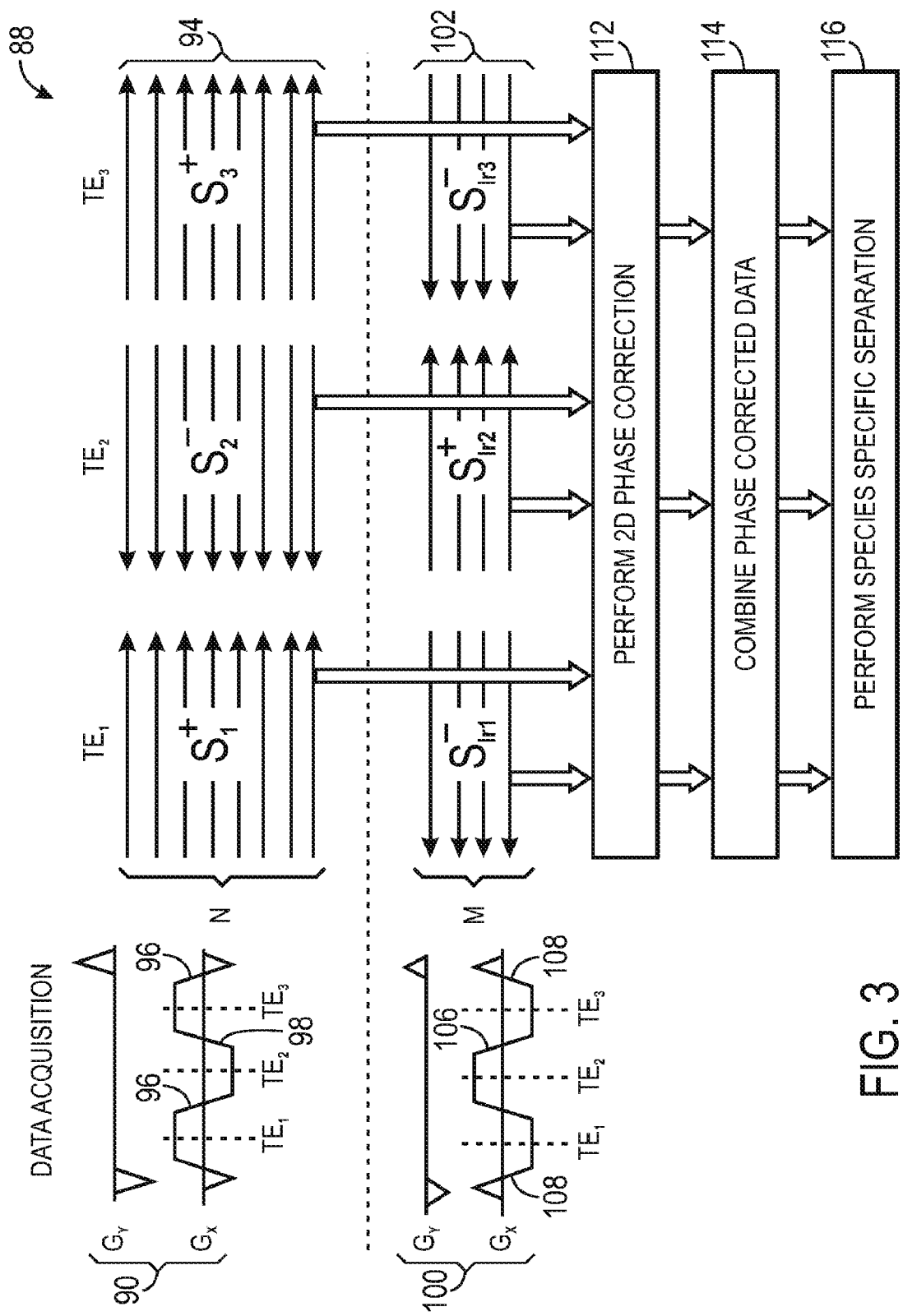
FIG. 3 depicts steps in a method for acquiring magnetic resonance imaging data and generating water and fat images using the data in accordance with an aspect of the present disclosure.

As depicted in FIG. 3, In a data acquisition step (block 88) a first pulse sequence 90 may be employed to collect N lines of data 94 at three different echo times ($TE_1$, $TE_2$, $TE_3$). In the depicted example, regular data acquired at $TE_1$ and $TE_3$ correspond to the positive gradient lobes 96 while data acquired at $TE_2$ corresponds to the negative gradient lobe 98. In addition, a second pulse sequence 100 may be employed to collect M lines of reference data 102 at the same three echo times ($TE_1$, $TE_2$, $TE_3$). In one embodiment, sixteen lines of reference data are acquired with the reversed gradient polarity (i.e., M=16). In the depicted example, reference data acquired at $TE_1$ and $TE_3$ correspond to the negative gradient lobes 108 while data acquired at $TE_2$ corresponds to the positive gradient lobe 106. As a result of the data acquisition step, phase-encoded regular data 94 and corresponding phase-encoded reference data 102 of the opposite polarity are collected at the same echo times. As depicted in FIG. 3, and discussed in greater detail below, the N lines of regular data and the M lines of reference data may be provided to subsequent steps that allow the correction (block 112) of two-dimensional phase error from the signals, the combination (block 114) of the phase corrected data, and the separation (block 116) of different species, (e.g., water and fat) signals using the combined phase corrected data.

For example, in one embodiment, as depicted in FIG. 3, regular data 94 and corresponding reference data 102 with opposite gradient polarities may be used to estimate the two-dimensional phase error (block 112). For example, in one embodiment, the two-dimensional phase error $\theta_i(x,y)$ can be estimated by subtracting the phases of the data acquired with the opposite gradient polarity. An example of an equation describing such an operation is as follows:

$$\theta_i(x,y) = \angle(s_i^+(x,y) \cdot \{s_i^-(x,y)\}^*)/2 \quad (2)$$

where $\angle$ represents the angle operation and where "*" denotes the complex conjugate. In certain embodiments where M<N, low resolution images of $s_i^\pm(x,y)$ may be used for the phase correction process. In addition, in certain embodiments, instead of taking the phase of the complex conjugation multiplication, the phase error may instead be obtained by dividing the signals of $s_i^\pm(x,y)$. Once the two-dimensional phase error is estimated, this estimate may be applied back to $s_i^\pm(x,y)$ to remove, e.g., demodulate, the two-dimensional phase error from the signal.

This phase correction step may be implemented in a variety of ways. For example, in one embodiment the two-dimensional phase error $\theta_i(x,y)$ may be divided in to two parts, a dominant phase error in the read-out direction (e.g., x) and the remaining higher order two-dimensional (e.g., x,y) phase error such that:

$$\theta_i(x,y) = \theta_i(x) \cdot \hat{\theta}_i(x,y) \quad (3)$$

Such a separation may be desirable in circumstances where the one-dimensional dominant phase component is large relative to the higher order phase component and/or where it may be useful to perform different operations on the one-dimensional and two-dimensional components. For example, certain operations (such as phase unwrapping and polynomial fitting) may be simpler when performed on one-dimensional signals.

Figure 4:
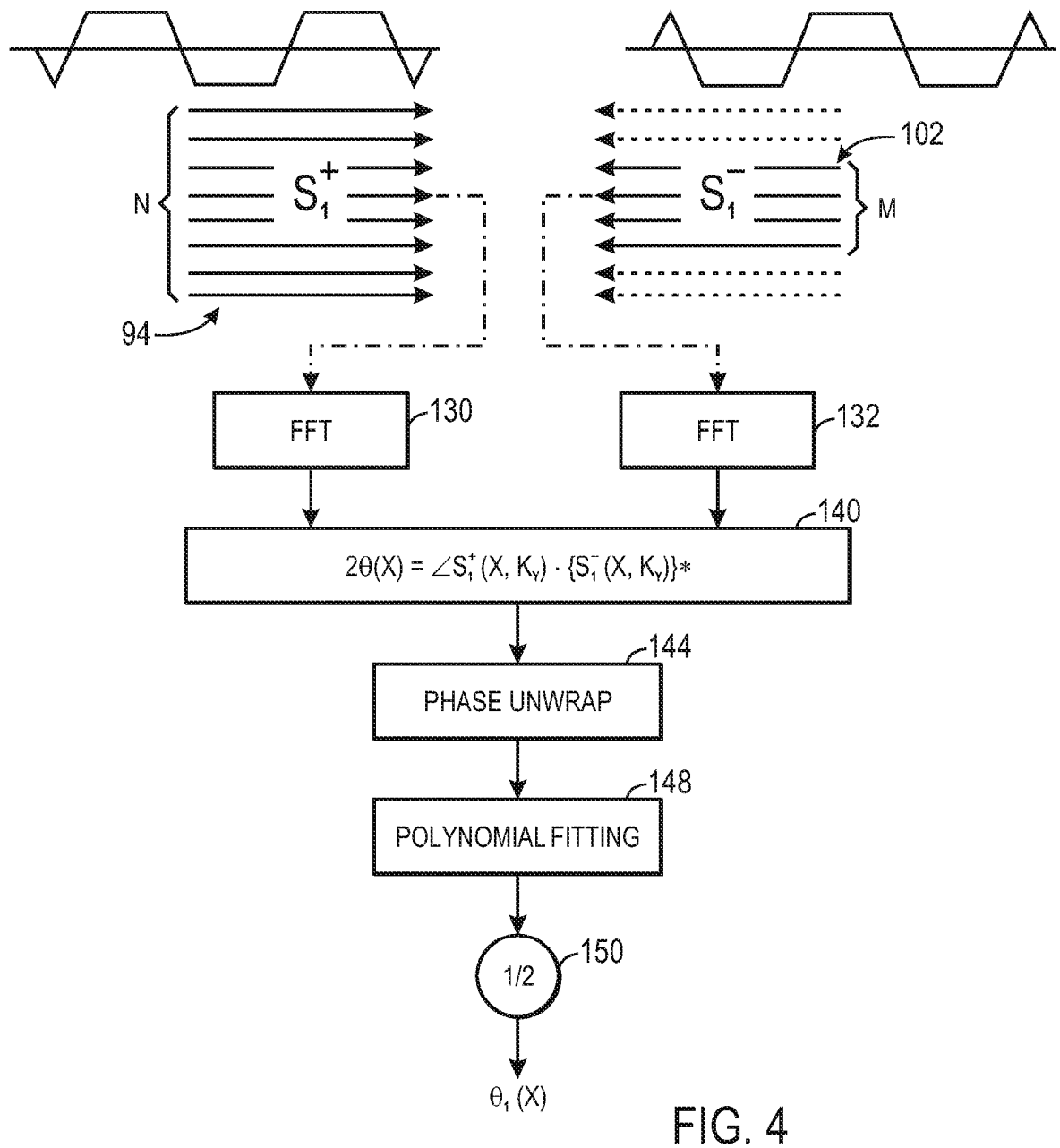
FIG. 4 depicts steps in a method for determining one-dimensional phase error in accordance with an aspect of the present disclosure.

In one example of an embodiment in which the dominant phase error $\theta_i(x)$ is estimated, the center lines (at $k_y$ index) of opposite gradient polarities may be used to generate the estimate. For example, referring now to FIG. 4, the center line (at $k_y$ index) of regular data 94 and the corresponding center line of reference data of the opposite polarity acquired at a given echo time, such as TE1, may separately undergo a fast Fourier transform (FFT) (blocks 130, 132) to generate respective signal vectors. A phase difference of the two signal vectors may be obtained (block 140), such as via the equation:

$$2\theta(x) = \angle s_i^+(x,k_y) \cdot \{s_i^-(x,k_y)\}^* \quad (4)$$

where $\angle$ represents the angle operation and where "*" denotes the complex conjugate. In one embodiment, the calculated phase difference represents an estimate of $2 \cdot \theta_i(x)$. Because $\theta_i(x)$ may exceed $\pi$, $2 \cdot \theta_i(x)$ may be unwrapped (block 144) in such embodiments. To extrapolate the estimated phase of the background areas, the unwrapped phase may be fit (block 148) to a polynomial, such as a third-order polynomial. The estimated $2 \cdot \theta_i(x)$ is then divided by 2 to obtain $\theta_i(x)$ (block 150). This process may be repeated to generate polynomial phase profiles for all slices. In one such embodiment, the median phase polynomial over all slices may be calculated and may be used as the dominant phase error profile $\theta_i(x)$ for each echo. In addition, in certain embodiments, it may be possible to correct for the linear phase error in the readout direction only, such as by estimating the linear phase error by re-aligning the k-space center of $s_i^\pm(x,y)$. In such an embodiment, the non-linear phase component may be estimated and corrected in subsequent steps, as discussed below.

Figure 5:
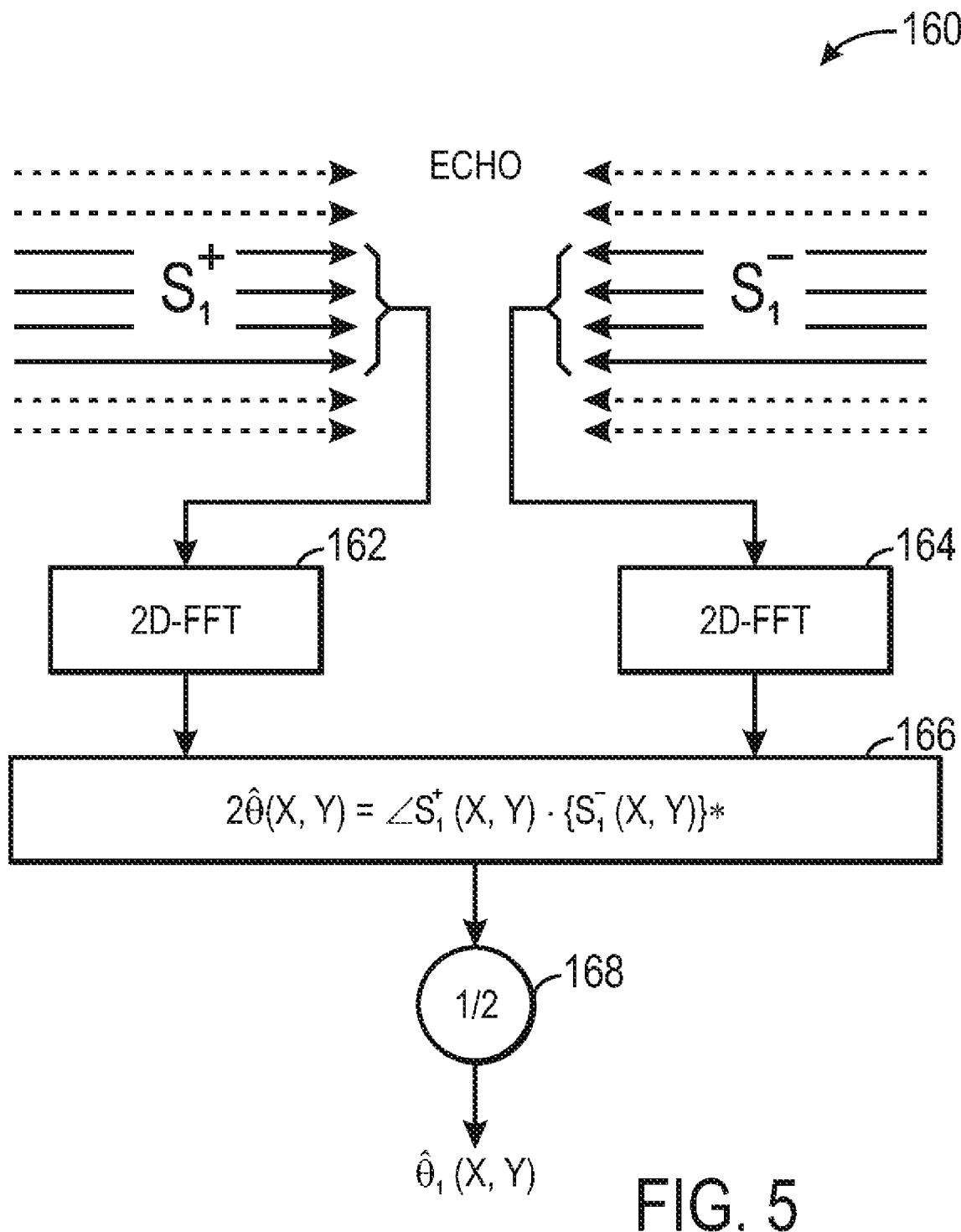
FIG. 5 depicts steps in a method for determining two-dimensional phase error in accordance with an aspect of the present disclosure.

Therefore, in certain embodiments the dominant phase error may be calculated and removed and the higher order two-dimensional phase error $\hat{\theta}_i(x,y)$ can be estimated, such as via simple subtraction of the two-dimensional phase. For example, turning now to FIG. 5, one example of such a subtraction process 160 is depicted which is similar to the previously described technique for estimating the one-dimensional dominant phase error. In the depicted example, the phase unwrapping step is omitted since, where the higher order phase error is small relative to the dominant phase error, such a phase unwrapping step may be unnecessary. In other embodiments, phase unwrapping may be performed. In addition, as depicted in the example, a two-dimensional fast Fourier transform (2D-FFT) is separately performed (blocks 162, 164) on each set of opposite polarity data for a give echo time (e.g., TE1) and a phase difference generated as discussed above. To account for the two-dimensional nature of the phase error, the phase difference may be calculated by the equation:

$$2\hat{\theta}(x,y)=\angle s_i^+(x,y)\cdot\{s_i^-(x,y)\}^*. \quad (5)$$

$2\hat{\theta}(x,y)$ is divided by 2 (block 168) and used as the higher-order two-dimensional phase error profile $\hat{\theta}_i(x,y)$ for each echo. While the preceding treats the handling of the dominant and higher-order phase error separately for the sake of simplicity, in other embodiments, these steps may be computationally combined into a single step. In such embodiments, the phase error may be processed using two-dimensional phase unwrapping algorithms. In addition, though the preceding describes halving the estimated phase in Equation 2 and in FIGS. 4 and 5, in an alternative embodiment the estimated phase, without halving, can be used to correct the phases of the even echoes such that they are modulated as if they were acquired with the positive gradient polarity. In such an embodiment, phase unwrapping may be avoided.

After correction of the two-dimensional phase errors, the signals $s_i^\pm(x,y)$ may be combined to recover the intrinsic signal, $s_i(x,y)$. In one embodiment, this combination may be accomplished by averaging the phase corrected signals $s_i^\pm(x,y)$ such that:

$$(s_i^+(x,y)\cdot e^{-j\theta_i(x,y)}+s_i^-(x,y)\cdot e^{+j\theta_i(x,y)})/2 = s_i(x,y)\cdot F(x)+s_i(x,y)\cdot F(-x). \quad (6)$$

Because M may not equal N, the combination step may be performed in k-space such that the phase corrected k-space lines at the same phase encoding position are averaged.

In addition, the amplitude component of the bandpass filter asymmetry in general can be modeled as a linear response with the center of the filter having a perfect response, such that:

$$F(x)=1+a\cdot x \quad (7)$$

where it is assumed that x=0 is the center of the read-out line. Thus:

$$(s_i^+(x,y)\cdot e^{-j\theta_i(x,y)}+s_i^-(x,y)\cdot e^{+j\theta_i(x,y)})/2 \quad (8)$$

which equals $$(s_i(x,y)\cdot F(x)+s_i(x,y)\cdot F(-x))/2 \quad (9)$$

which equals $$(s_i(x,y)\cdot(1+ax)+s_i(x,y)\cdot(1-ax))/2 \quad (10)$$

which equals $$s_i(x,y). \quad (11)$$

In this manner, it can be seen via Equations 8-11 that the amplitude modulation due to the bandpass filter asymmetry is effectively removed from the bipolar signals. In addition, Equations 8-11 demonstrate that acquired data, including the reference data, contributes to the overall signal used to generate the final images, i.e., the signal-to-noise ratio (SNR) is increased by the acquisition of the reference data. Thus, in certain embodiments even though the scan time is increased by the amount of time used to acquire the additional reference data for phase correction, i.e., the M lines of reference data 102 described in FIG. 2, the overall SNR efficiency of the scan may be the same as for a bipolar acquisition without the additional acquisition of the reference data.

In certain embodiments, the phase corrected and combined signals $s_i(x,y)$ may be processed by a species separation algorithm. Such species separation algorithms may include the IDEAL water-fat separation algorithm, T2*-IDEAL water-fat-T2* algorithm, and other suitable water-fat (or water-fat-silicone) separation algorithms. In addition, in certain embodiments, a suitable species separation algorithm may include an IDEAL algorithm suitable for separating signals of non-proton species, such as C13 signals from pyruvate, lactate, alanine, and/or bicarbonate. The separated signals may be used to produce species specific images, such as water and fat images. Such species specific images may be stored and/or displayed at a local operator workstation 46 and/or at a remote or networked location, such as PACS/teleradiology site 56 (FIG. 1). For example, a radiologist at either a local or remote site may review current or stored water and/or fat images to make diagnostic determinations or as the basis for ordering additional examinations. Likewise, in certain embodiments, the species specific (e.g., water and/or fat) images may be provided to one or more CAD algorithms for an automated review and evaluation.

The techniques described herein may, in certain embodiments, be generally applicable to multi-point (e.g., two or three echoes) species separation approaches. However, the present techniques may more generally be applied to an arbitrary number of echoes, not just two or three. For example, for two-point water-fat separation algorithms phase error may be less of an issue with bipolar gradients. However, removing the dominant phase error may improve the robustness of the water-fat separation. Conversely, in acquisitions where water, fat, and T2* are simultaneously decomposed, longer echo trains may be employed. In certain embodiments, the multi-echo signals are processed to estimate a T2 or T2* relaxation rate without separating chemical species. Thus, the present techniques may be generally applicable to approaches where two or more echoes are acquired and tissue characterization is performed.

In addition, though bipolar applications are generally discussed above by way of example. In other embodiments the present approaches may be employed with unipolar multi-echo sequences. For example, in unipolar acquisitions eddy current induced phase error may be slightly different for the first echo compared to the subsequent echoes. The techniques discussed herein may be useful to correct for this inconsistency in the phase error.

Further, the techniques discussed herein are not limited to use with gradient-echo based techniques, but may also be used in conjunction with spin-echo based multi-echo sequence approaches. In addition, aspects of the present disclosure may be used in conjunction with parallel imaging techniques, whether externally calibrated or self/auto-calibrated. In such embodiments, the full resolution acquisition and/or the reference acquisition may be accelerated. For example, the parallel imaging reconstruction can be performed first, followed by implementation of the phase correction algorithm as discussed herein. Alternatively, the phase correction may be performed with the accelerated data with the parallel imaging being performed on the phase corrected data.

Technical effects of the invention include removing two-dimensional phase error from magnetic resonance imaging signals. Technical effects of the invention further include generating species specific images based on the magnetic resonance signals from which the two-dimensional phase error has been removed. In addition, other technical effects include removing amplitude error from magnetic resonance imaging signals. Species specific images may also be generated based on the magnetic resonance signals from which the amplitude error has been removed.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for processing a magnetic resonance image, the method comprising the steps of:
   acquiring a first set of lines of magnetic resonance imaging signals with a first read-out gradient at at least two echo times;
   acquiring a second set of lines of magnetic resonance imaging signals with a second read-out gradient that has reversed polarity with respect to the first read-out gradient at the same echo times; and
   determining a two-dimensional phase error using the first set of lines of magnetic resonance imaging signals and the second set of lines of magnetic resonance imaging signals.

2. The method of claim 1, wherein the first readout gradient and the second readout gradient are bipolar readout gradients.

3. The method of claim 1, wherein determining the two-dimensional phase error comprises subtracting the phases of the signals acquired with reversed gradient polarities as represented in the second set of lines of magnetic resonance imaging signals and the first set of lines of magnetic resonance imaging signals.

4. The method of claim 1, wherein determining the two-dimensional phase error comprises solving for $\theta_i(x,y) = \angle(s_i^+(x,y) \cdot \{s_i^-(x,y)\}^*)/2$.

5. The method of claim 1, comprising removing the two-dimensional phase error from at least the first set of lines of magnetic resonance imaging signals to generate a set of phase corrected data.

6. The method of claim 5, comprising combining the set of phase corrected data to recover an intrinsic signal.

7. The method of claim 6, wherein combining the set of phase corrected data removes amplitude modulation from the intrinsic signal.

8. The method of claim 6, wherein combining the set of phase corrected data occurs in k-space.

9. The method of claim 6, comprising processing the intrinsic signal by a species separation algorithm to generate one or more species specific images.

10. The method of claim 1, wherein determining the two-dimensional phase error comprises determining a one-dimensional phase error component and a two-dimensional phase error component.

11. A magnetic resonance imaging system, comprising:
   a scanner, comprising:
      a primary magnet coil;
      a set of gradient coils; and
      a RF coil;
   scanner control circuitry capable of controlling operation of the scanner, the scanner control circuitry comprising:
      a memory capable of storing a first pulse sequence and a second pulse sequence;
      control circuitry capable of implementing the first and the second pulse sequence using the primary magnet coil, the set of gradient coils, and the RF coil, wherein the first pulse sequence, when executed, generates a first set of lines of imaging signals having a first read-out gradient and wherein the second pulse sequence, when executed, generates a second set of lines of imaging signals having a second read-out gradient that has reversed polarity with respect to the first read-out gradient; and
   system control circuitry capable of controlling operation of the scanner control circuitry.

12. The magnetic resonance imaging system of claim 11, wherein the system control circuitry comprises an operator workstation capable of determining a two-dimensional phase error using the first set of lines and the second set of lines.

13. The magnetic resonance imaging system of claim 12, wherein the operator workstation determines the two-dimensional phase error by determining a one-dimensional phase error component and a two-dimensional phase error component.

14. The magnetic resonance imaging system of claim 13 wherein the operator workstation determines the one-dimensional phase error component by performing Fourier transforms of the first set of lines of imaging signals and the second set of lines of imaging signals.

15. The magnetic resonance imaging system of claim 14 wherein the operator workstation determines the one-dimensional phase error component by deriving a phase difference based on the results of the respective Fourier transforms.

16. The magnetic resonance imaging system of claim 13 wherein the operator workstation determines the two-dimensional phase error component by performing two-dimensional Fourier transforms of the first set of lines of imaging signals and the second set of lines of imaging signals.

17. The magnetic resonance imaging system of claim 16 wherein the operator workstation determines the two-dimensional phase error component by deriving a phase difference based on the results of the respective two-dimensional Fourier transforms.

18. A non-transient computer-readable medium physically encoding one or more routines comprising:
   a routine capable of acquiring first and second sets of lines of magnetic resonance imaging signals, wherein the first and second sets of lines have read-out gradient polarities that are opposite to one another;
   a routine capable of determining a two-dimensional phase error using the first and second sets of lines;
   a routine capable of recovering an intrinsic signal after correcting for the two-dimensional phase error; and
   a routine capable of generating one or more species specific images using the intrinsic signal.

19. The non-transient computer-readable medium of claim 18, wherein the routine capable of determining the two-dimensional phase error subtracts the phases of the respective magnetic resonance imaging signals having opposite bipolar gradients.

20. The non-transient computer-readable medium of claim 18, wherein the routine capable of recovering the intrinsic signal combines a set of imaging signals corrected using the two-dimensional phase error.

* * * * *